United States Patent [19]

Maeda

[11] Patent Number: 5,093,707
[45] Date of Patent: Mar. 3, 1992

[54] SEMICONDUCTOR DEIVCE WITH BIPLAR AND CMOS TRANSISTORS

[75] Inventor: Takeo Maeda, Kawasaki, Japan

[73] Assignee: Kabushiki Kaisha Toshiba, Kawasaki, Japan

[21] Appl. No.: 343,302

[22] Filed: Apr. 26, 1989

[30] Foreign Application Priority Data

Apr. 27, 1988 [JP] Japan .................. 63-104861
Jul. 8, 1988 [JP] Japan .................. 63-170683

[51] Int. Cl.⁵ ............... H01L 27/02; H01L 29/72
[52] U.S. Cl. .......................... 357/43; 357/35; 357/42; 357/44; 357/88; 357/90
[58] Field of Search ............ 357/43, 42, 41, 35, 357/44, 88, 90

[56] References Cited

U.S. PATENT DOCUMENTS

| | | | |
|---|---|---|---|
| 4,799,098 | 1/1989 | Ikeda et al. | 357/43 |
| 4,879,255 | 11/1989 | Deguchi | 357/43 |
| 4,907,058 | 3/1990 | Sakai | 357/42 |
| 4,929,570 | 5/1990 | Howell | 357/43 |
| 4,963,973 | 10/1990 | Watanabe et al. | 357/43 |
| 4,965,220 | 10/1990 | Iwasaki | 357/43 |
| 4,980,744 | 12/1990 | Watanabe et al. | 357/42 |

FOREIGN PATENT DOCUMENTS 62-291165 12/1987 Japan .................. 357/43

Primary Examiner—Andrew J. James
Assistant Examiner—Ngan V. Ngo
Attorney, Agent, or Firm—Finnegan, Henderson, Farabow, Garrett and Dunner

[57] ABSTRACT

A semiconductor device having CMOS transistors and bipolar transistors is disclosed. A P-type high concentration buried region is formed in the surface region of the semiconductor substrate. An N-type epitaxial layer is formed on the buried region. The semiconductor device includes a second well region of a PMOS transistor that is formed by introducing an N-type impurity into a part of the epitaxial layer, and a first well region of a bipolar transistor that is formed without introducing the N-impurity, after the formation of the epitaxial layer.

11 Claims, 11 Drawing Sheets

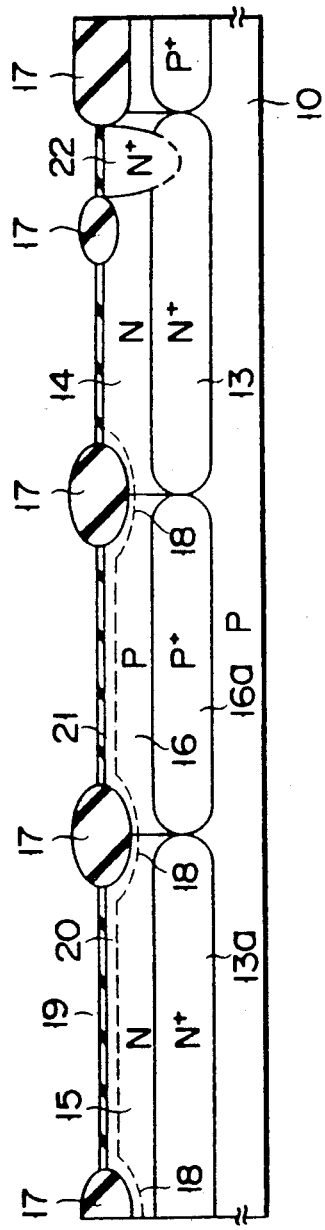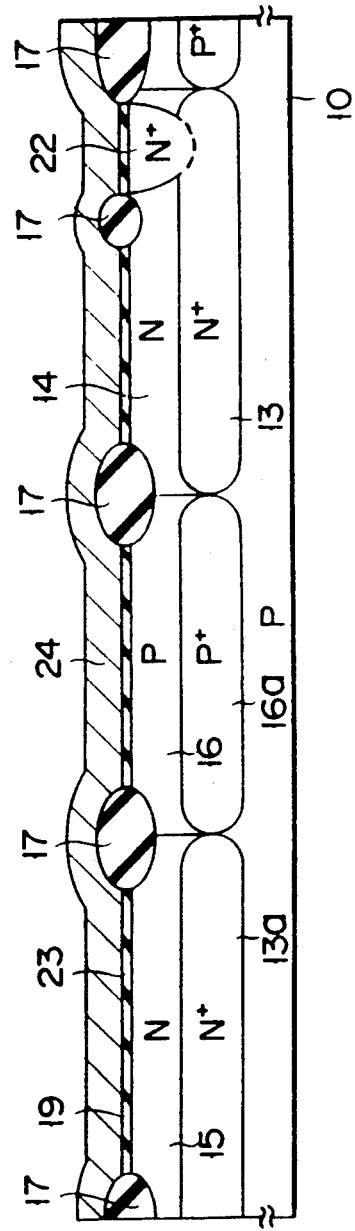
FIG. 4E
FIG. 4F

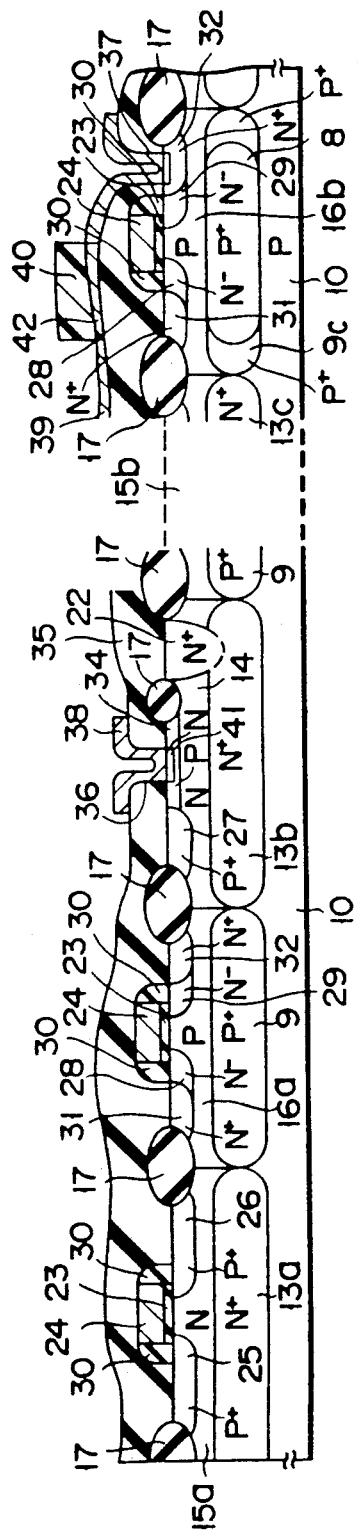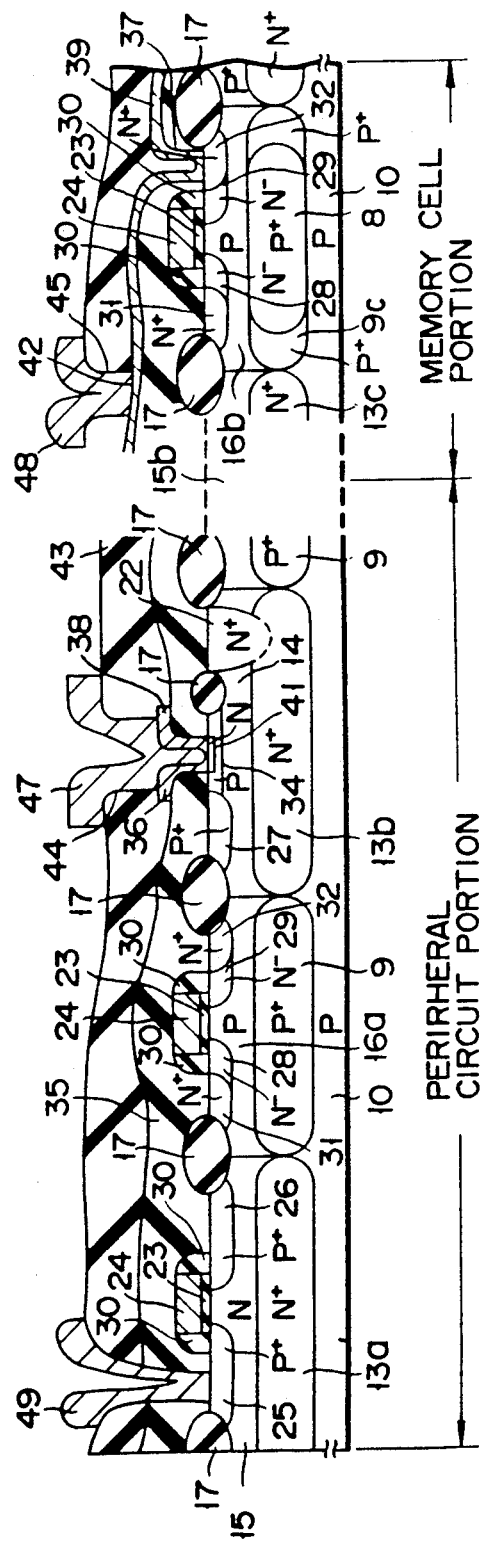
FIG. 8I
FIG. 8J

SEMICONDUCTOR DEIVCE WITH BIPLAR AND CMOS TRANSISTORS

BACKGROUND OF THE INVENTION

1. Field of the Invention

The present invention relates to a semiconductor device forming an LSI (large scale integrated circuit) containing bipolar transistors and CMOS transistors.

2. Description of the Related Art

A semiconductor device in which bipolar transistors and CMOS transistors are formed in a semiconductor substrate, conventionally, is formed in the following way. A plurality of N+ buried regions are selectively formed in a p-type silicon substrate. A P-type epitaxial layer of 2.0 to 5.0 μm thick is selectively formed over the entire surface of the structure. N-well regions are formed in bipolar transistor forming regions and PMOS transistor forming regions. P-well regions are formed in NMOS transistor forming regions and bipolar transistor isolating regions. In forming the P-well and N-well regions, an ion implanting method and a lithography method are used for selective doping of impurities. Then, the structure is annealed at 1100° C. or more for well diffusion. Thereafter, MOS transistors and bipolar transistor are formed in a usual manner.

FIG. 1 shows a sectional view of an LSI structure containing bipolar transistors and CMOS transistors that are formed by a conventional technique. FIG. 2 shows a profile of a distribution of impurity concentration in the N-well region for bipolar transistor and PMOS transistor. FIG. 3 shows a profile of a distribution of impurity concentration in the P-well region for an NMOS transistor. In FIG. 1, reference numeral 51 designates P-type semiconductor substrate; 52 an N+ buried region., 53 and 57 N-well regions, 54 element insulating region; 55 N+ buried lead electrode; 56 a P-well; 58 a gate oxide film; 59 a gate polycrystalline silicon layer; 60 an interlaying insulating film; 61 an emitter polycrystalline silicon layer; 62 an N+ emitter region, 63 internal base region; 64 a P field layer; 65 an N− region of the LDD structure; 66 an N+ region; 67 a P− region; 68 an external base region; 69 a side wall for forming the N+ region; 70 an interlayer insulating film; and 71 an aluminum (Al) electrode.

In the LSI structure manufactured by the conventional technique, as the microfabrication of the MOS transistors further progresses, a concentration in the N-well region 57 of the PMOS transistor is increased in order to prevent occurrence of a short channel effect of the MOS transistor, for example. When a bipolar transistor is formed in the N-well region 53 that is formed simultaneously with the N-well region 57, an impurity concentration in the collector of the bipolar transistor increases. When the impurity concentration of the collector of the bipolar transistor increases, a breakdown voltage $BV_{CBO}$ between the base and collector of the transistor and an early voltage $V_{AF}$, which are fundamental performances of the bipolar transistor, are degraded. When the PMOS-FET gate length becomes shorter than 0.8 μm, the degradation occurs.

When using the conventional technique, a P-type epitaxial layer is first formed, and the N-well regions 53 and 57 are formed in the epitaxial layer. In this case, the N-wells 53 and 57 must have impurity concentration profiles required for the PMOS transistor and the bipolar transistor. To this end, a well diffusion process is performed. When the well diffusion process is used, P+ buried regions 84 must be formed in the N-well regions 53 and 57 in order to prevent occurrence of a punch-through in those regions. In the structure containing the buried region 84, when the well diffusion process progresses, impurities are actively diffused from the buried region 84 toward the region located above the buried region. Such a diffusion will have an adverse effect on the characteristics of the MOS transistor. For the above reason, there is a limit increasing an impurity concentration of the P+ buried region.

When the well diffusion process is used for forming the collector of the bipolar transistor, a profile of an impurity concentration of the collector of the transistor has an inclination declining from the surface of the collector inwardly. Therefore, the bipolar characteristic is degraded in a high current region.

Accordingly, an object of the present invention is to provide a semiconductor device which can provide improved electric characteristics of bipolar transistors and MOS transistors even if those different types of transistors are formed in the same semiconductor substrate, and has a high soft error resistance.

SUMMARY OF THE INVENTION

According to one aspect of the present invention, there is provided a semiconductor device constituting an LSI containing bipolar transistors and CMOS transistors according to the present invention wherein first and second N-well regions in which a bipolar transistor and a PMOS transistor are respectively formed, have different impurity concentrations. The semiconductor device according to the present invention is further featured in that a concentration of N-type impurity, in an epitaxial layer forming first N-well regions in which bipolar transistors are formed is set at a value in the range from $5 \times 10^{15}$ cm$^{-3}$ to $2 \times 10^{16}$ cm$^{-3}$. The semiconductor device according to the present invention is further featured in that an N+ buried region is formed under the bipolar transistor, and additionally a P+ buried region is located under a P-well region of an NMOS transistor.

According to another aspect of the present invention, there is provided a semiconductor device constituting an LSI containing bipolar transistors and CMOS transistors according to the present invention which has first and second N-well regions in which a bipolar transistor and a PMOS transistor are respectively formed having different impurity concentrations, wherein, after an N-type epitaxial layer is formed in a P-type substrate, the impurity to form an N-well region in a PMOS transistor region and the impurity to form a P-well region in an NMOS transistor region are respectively implanted into the transistor regions by ion implantation, thereby forming a second N-well region and a P-well region which have impurity concentrations are set at between $2 \times 10^{16}$ cm$^{-3}$ to $2 \times 10^{17}$ cm$^{-3}$.

According to yet another aspect of the present invention, there is provided a semiconductor device constituting an LSI containing bipolar transistors and CMOS transistors according to the present invention which has first and second N-well regions in which a bipolar transistor and a PMOS transistor are respectively formed having different impurity concentrations, wherein a P+ buried region between a P-type substrate and an N-type epitaxial layer is set at between $1 \times 10^{16}$ cm$^{-3}$ to $5 \times 10^{17}$ cm$^{-3}$ and a subsequent annealing is applied within ten minutes at a temperature of 1050° C. or more, to prevent the impurity being diffused from the P⁻ buried region.

According to the present invention, an epitaxial layer which has an impurity concentration suitable for the collector (first N-well region) of a bipolar transistor is formed in a P-type semiconductor substrate. Further, impurity ions are implanted into a PMOS transistor forming region in the epitaxial layer, thereby to form a second N-well region which has an impurity concentration suitable for a PMOS transistor. No ions are doped into the collector of the bipolar transistor in the epitaxial layer. No well diffusion is performed for forming the well regions of the bipolar transistors and the CMOS transistors, although such a well diffusion is required in the conventional technique. Therefore, even if the P⁺ buried region which is provided for preventing the punch-through is set at a high impurity concentration, no impurity is diffused from the buried region to the layer above the buried region. Thus, according to the present invention, two different types of high performance transistors, CMOS and bipolar transistors, can be realized in the same substrate. Further, a semiconductor device containing such high performance transistors is insensitive to soft errors.

BRIEF DESCRIPTION OF THE DRAWINGS

FIGS. 4A through 4J are sectional views showing a manufacturing process for manufacturing a semiconductor device according to an embodiment of the present invention;

FIGS. 8A through 8J are sectional views showing a manufacturing process for manufacturing a semiconductor device according to another embodiment of the present invention;

DETAILED DESCRIPTION OF THE PREFERRED EMBODIMENTS

Figure 1:
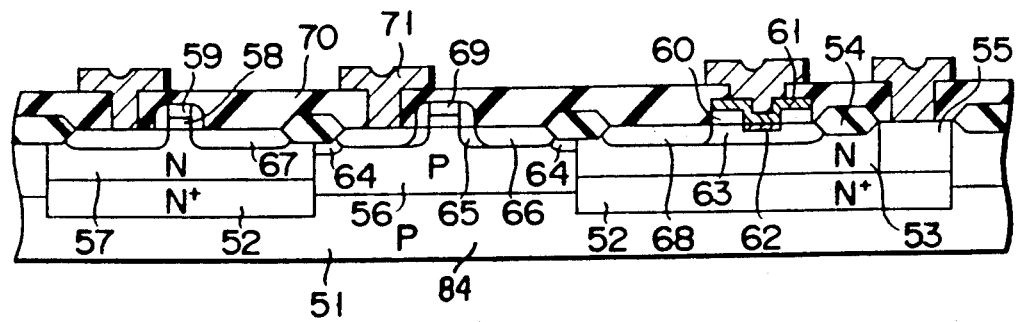
FIG. 1 shows a sectional view of a conventional LSI in which bipolar transistors and CMOS transistors coexist.
Figure 2:
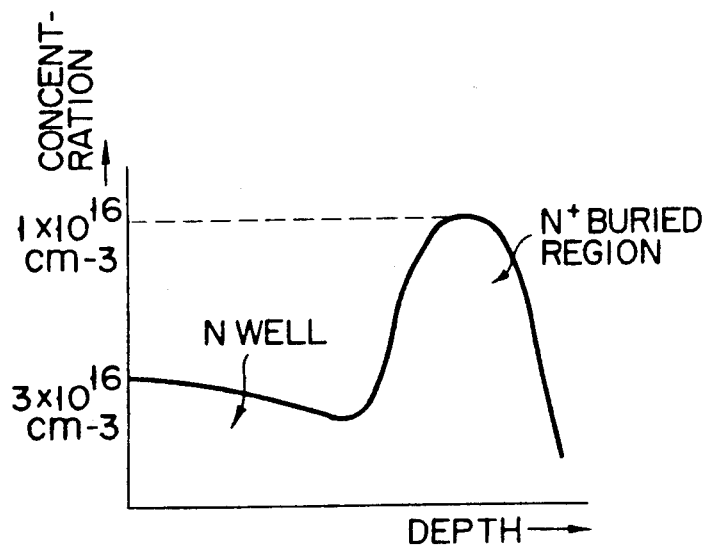
FIG. 2 is a graph showing a profile of an impurity concentration in the N-well region for the bipolar and PMOS transistors shown in FIG. 1.
Figure 3:
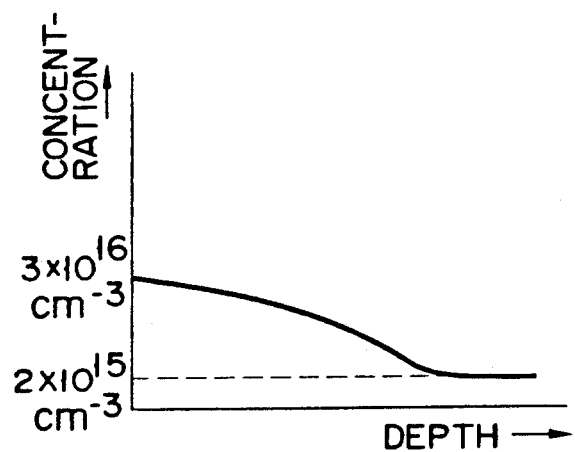
FIG. 3 is a graph showing a profile of an impurity concentration in the P-well region for the NMOS transistors shown in FIG. 1.

FIGS. 4A through 4J show a sequence of process steps of a method of forming a semiconductor device according to a first embodiment of the present invention.

To start, an insulating film 11 is deposited on the crystal surface of a P-type silicon semiconductor substrate 10. The crystal indices of the crystal surface is (100). The insulating film 11 is selectively etched away by a photoetching method, to form openings 12. The openings 12 define the locations at which N⁺ buried collector regions 13 and 13a are to be formed. Subsequently, to form the N⁺ buried collector regions 13 and 13a, antimony Sb is vapor phase diffused into the surface region of the substrate 10 through the openings 12. Alternatively, arsenic As or Sb is ion implanted through the openings 12. See FIG. 4A.

The remaining insulating film 11 is completely removed. After the removal of the film 11, boron B is ion implanted into the surface regions of the substrate 10 except the N⁺ buried collector regions 13 and 13a, thereby to form P⁺ buried regions 16a, by using a photoetching method. The condition of the ion implantation of boron B is, for example, 100 KeV of accelerating voltage and $1.5 \times 10^{13} cm^{-2}$ of dosage. See FIG. 4B. The N⁺ buried collector regions 13 and 13a and the P⁺ buried region 16a may be formed by using a self-align method. Thereafter, an N-type epitaxial layer 14 containing phosphorus P of $1 \times 10^{16}$ cm⁻³ is formed over the entire surface of the substrate 10 by an epitaxial growth method. Temperature for the epitaxial growth is 1130° C. The thickness of the layer 14 is 1.2 μm. See FIG. 4C.

A mask (not shown) for ion implantation is formed by a photoetching method. By using this mask, phosphorus P ions are doped into regions of the N-type epitaxial layer 14 in which PMOS transistors are to be formed. As a result, N-well regions 15 are selectively formed. In this case, the P ions are accelerated at 160 KeV and $5 \times 10^{12}$/cm² of dosage. Then, by using another mask for ion implantation, boron B ions are doped into regions of the N-type epitaxial layer 14 in which NMOS transistors are to be formed. As a result, P-well regions 16 are selectively formed. In this case, the P ions are accelerated at 100 KeV and $6 \times 10^{12}$/cm² of dosage. See FIG. 4D. In this process step, the formation of the N-well region 15 follows the formation of the P-well region 16.

Succeedingly, field oxide films 17 to isolate MOS transistors from one another and MOS transistors from bipolar transistors are formed by a selective oxidizing method. The thickness of the field oxidizing film 17 is approximately 6000 Å. Before formation of the field oxide films 17, an ion doping region 18 for preventing field inversion is formed in a self-align manner. A dummy gate oxide film 19 of 150 Å in thick is formed over the entire surface of the structure by thermal oxidization. Thereafter, channel ion doping regions 20 and 21 that are for making uniform the threshold values of P- and N-channel MOS transistors and for preventing occurrence of punch-through phenomenon, are respectively formed in the surface regions of the N- and P-well regions 15 and 16, through the dummy gate oxide film 19. To form the channel ion doping region 20 for the N-well region 15, B ions are first implanted at 20 KeV of acceleration voltage and $3 \times 10^{12}$/cm² of dosage. Then, P ions are doped at dosage of $2 \times 10^{12}/cm^2$ under acceleration voltage of 240 KeV. To form the channel ion doping region 21 for the N-well region 16, B ions are first implanted at 20 KeV of acceleration voltage and $4 \times 10^{12}/cm^2$ of dosage. Then, P ions are doped at dosage of $1 \times 10^{16}/cm^2$ under acceleration voltage of 320 KeV, thereby to form a deep N+ type ion doping region 22 that passes through the epitaxial layer 14 and reaches the buried collector region 13. See FIG. 4E.

Then, the dummy gate oxide film 19 is completely removed, and a gate oxide film 23 of about 150 Å in thick is formed over the entire surface of the structure by an oxidizing process. Further, polycrystalline silicon is deposited over the entire surface of the structure by CVD (chemical vapor deposition), thereby to form a polycrystalline silicon layer 24 of a predetermined thickness. Subsequently, phosphorus P is diffused into the polycrystalline silicon layer 24, thereby to lower a resistance of the layer 24. See FIG. 4F.

The polysilicon layer 24 and the gate oxide film 23 are patterned by a photoetching process, while leaving the gate electrodes and the N-well regions of the MOS transistors on the N-well regions 15 and the P-well regions 16. The structure is placed in an oxygen atmosphere and heated at 900° C., to form a post oxide film 50 over the entire surface of the structure. The entire surface of the structure is coated with photoresist to form a photoresist film. Then, the photoresist film is patterned to expose predetermined regions. Succeedingly, with a mask of the field oxide films 17 and the gate electrodes, $BF_2^+$ ions are doped into the N-well region at the acceleration voltage of 50 KeV and the dosage of $5 \times 10^{15}/cm^2$, so that a P+-type source region 25 and a drain region 26 are formed in the surface region of the N-well region 15. At this time, $BF_2^+$ ions are doped into the N-type epitaxial layer 14 on the buried collector region 13, to form an external base region 27 of a bipolar transistor. Further, with a mask of the field oxide film 17 and the gate electrode, phosphorus ions are implanted into the P-well region 16 under the condition of 60 KeV of acceleration voltage and $4 \times 10^{13}/cm^2$, to form an N-type source region 28 and a drain region 29 in the surface region. See FIG. 4G.

The entire surface of the structure is covered with a CVD-SiO$_2$ film 30 of 2000 Å. The CVD-SiO$_2$ film 30 is selectively etched away, leaving the film 30 on only the side wall of the gate electrode. For the etching, an anisotropy etching process such as RIE (reactive ion etching) process. A photoresist mask (not shown) is formed allowing only the P-well region to be exposed. The P-well region 16 is doped with arsenic As ions under the condition of 50 KeV of acceleration energy and $5 \times 10^{15}/cm^2$ of dosage, so that an N+-type source region 31 and a drain region 32 are formed in the surface region of the P-well region 16. In this way, an N-channel MOS transistor of the so-called LDD structure is formed in this P-well region 16. After the photoresist mask (not shown) is removed, the structure is placed in an O$_2$ atmosphere and heated at 900° C. for 30 minutes. As a result, a post-oxide film 33 is formed. Then, the surfaces of the P-well region 16 and the N-well region 15 are covered with a photoresist 51. Following this, $BF_2$ ions are implanted into the N-epitaxial layer 14 on the buried collector region 13, under the condition of 30 KeV of acceleration energy and $5 \times 10^{13}/cm^2$ of dosage. By this doping of $BF_2$, a P-type internal base region 34 is formed in the N-type epitaxial layer 14 on the buried collector region 13. See FIG. 4H.

SiO$_2$ is deposited over the entire surface of the structure, to form a CVD-SiO$_2$ film 35 of 2000 Å thick as an interlaying insulating film. The CVD-SiO$_2$ film 35 is selectively etched away to form a contact hole 36 reaching the surface of the internal base region 34, and a contact hole 37 reaching the surface of the N+-type drain region 32 for the N-channel MOS transistor. Thereafter, polycrystalline is deposited to form a polycrystalline layer of 2000 Å. The polycrystalline layer is patterned while polysilicon layers at only the locations where the emitter electrode and high resistance element, and interconnection wires are to be formed, and those polysilicon layers are denoted as 38 and 39. After the polycrystalline layer 39 is partially covered with a mask 40 of photoresist, as ions are implanted into the polycrystalline layers 38 and 39 at 50 KeV and $5 \times 10^{15}/cm^2$, to form an N-type emitter region 41 in the internal base region 34. At the same time, a resistance of the polycrystalline silicon layer 38 is reduced to form an emitter electrode of the bipolar transistor. A resistance of the polycrystalline silicon layer 39 except a portion of it covered with the mask 40 is reduced to form a drain interconnection 39 and a high resistance element 42. To secure better contact characteristics, the structure is preferably subjected to a rapid anneal after the above ion implantation. In the anneal, the structure is heated to between 950° C. to 1100° C. for 5 seconds to one minute. See FIG. 4I.

To flatten the surface of the structure, an interlayer insulating film 43 including a CVD-SiO$_2$ film and a BPSG film is formed over the entire surface of the structure. The interlayer insulating film 43 is opened to a contact hole 44 reaching to the surface of the polycrystalline silicon layer 38 as the emitter electrode, a contact hole 45 that reaches the surface of the polycrystalline silicon layer 39 as the drain electrode, and a contact hole 46 that passes the interlaying insulating film 43 and the CVD-SiO$_2$ film 35 underlying the film 43 and reaches the surface of the source of the P-channel MOS transistor. Aluminum for interconnection is deposited over the entire surface of the structure, and is patterned to form aluminum interconnections 47, 48 and 49. See FIG. 4J.

In the semiconductor device thus manufactured, a part of the polycrystalline silicon layer 39 serves as a high resistance element 42, which is used as a load resistor of a static memory cell.

Figure 5:
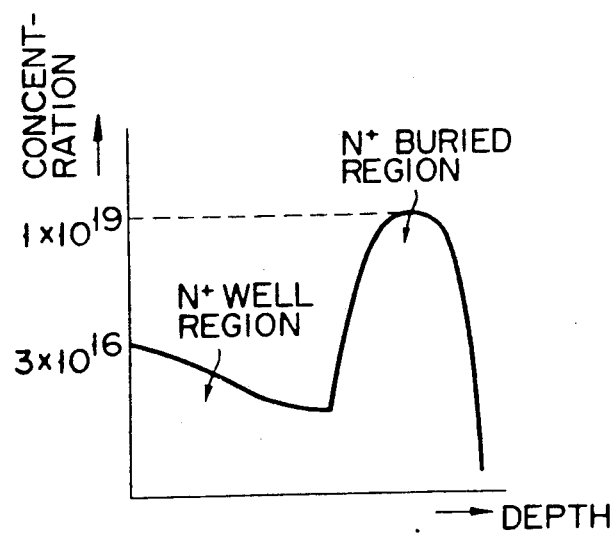
FIG. 5 is a graph showing a profile of an impurity concentration in a second N-well region for a PMOS transistor shown in FIG. 8J.
Figure 6:
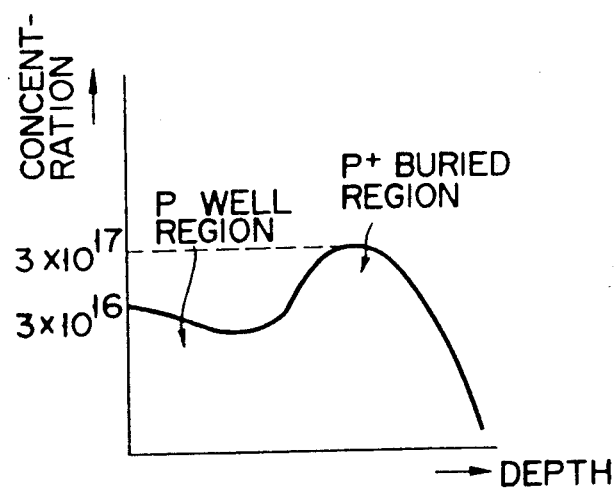
FIG. 6 is a graph showing a profile of an impurity concentration in a P-well region for an NMOS transistor shown in FIG. 8J.
Figure 7:
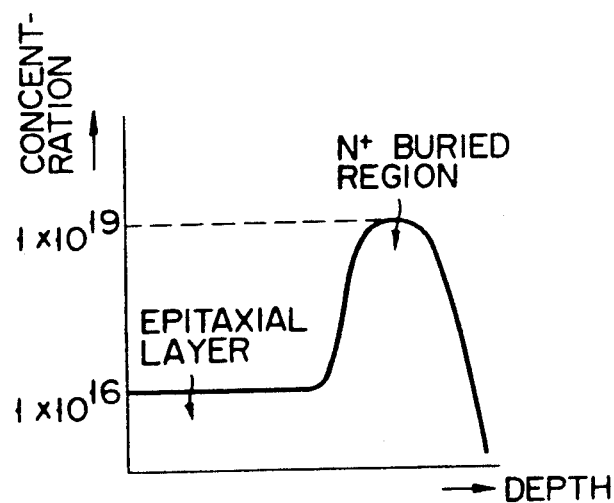
FIG. 7 is a graph showing a profile of an impurity concentration in a first well region for a bipolar transistor shown in FIG. 8J.
Figure 8A:
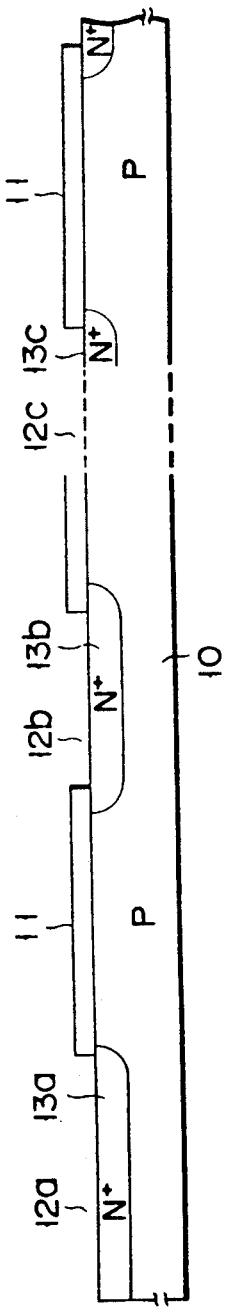
Figure 8B:
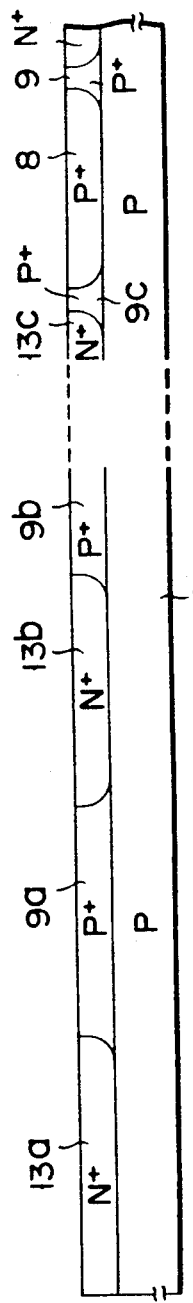
Figure 8C:
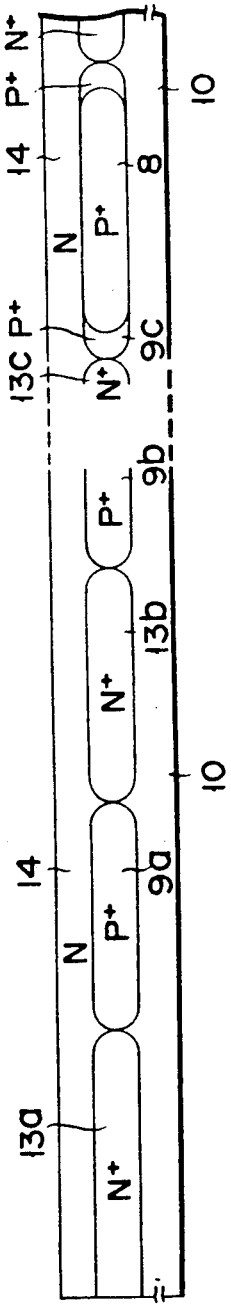
Figure 8D:
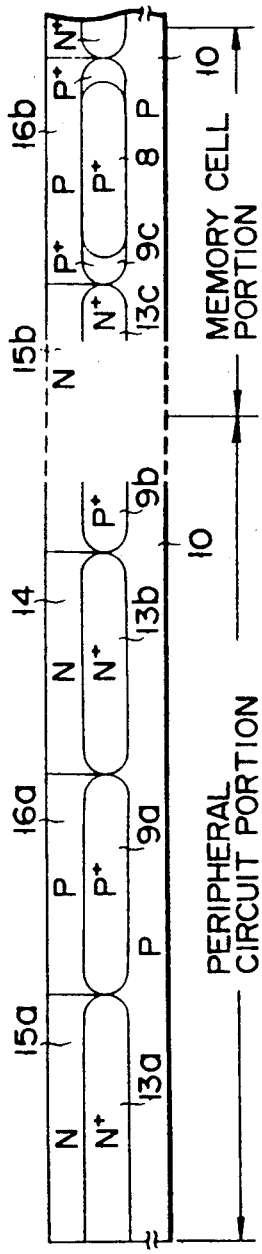
Figure 8E:
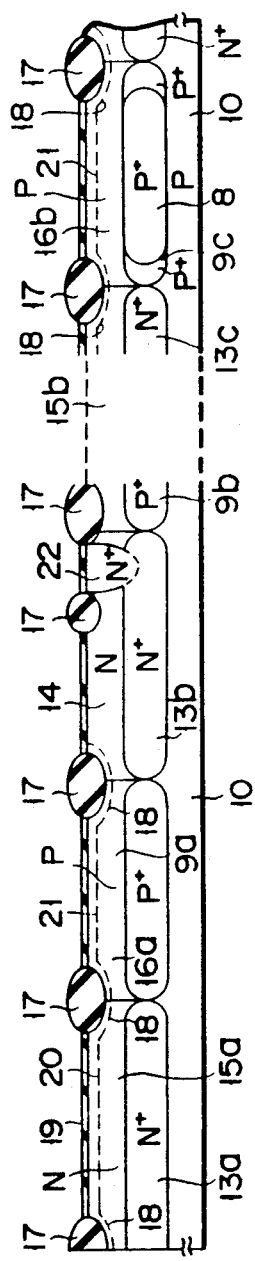
Figure 8F:
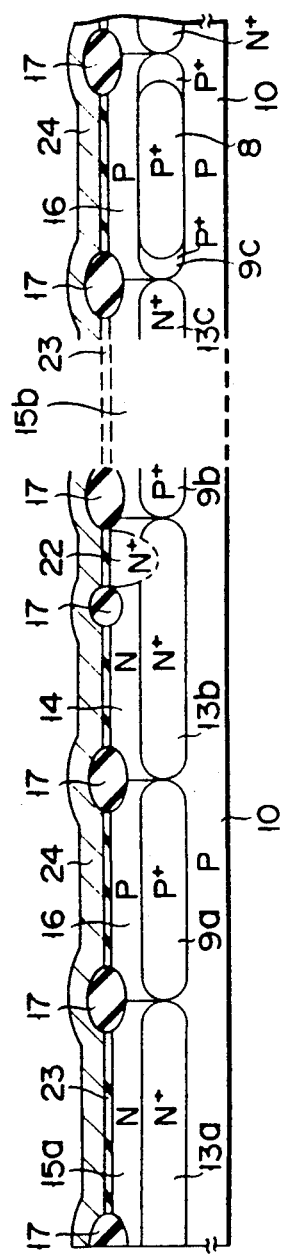
Figure 8G:
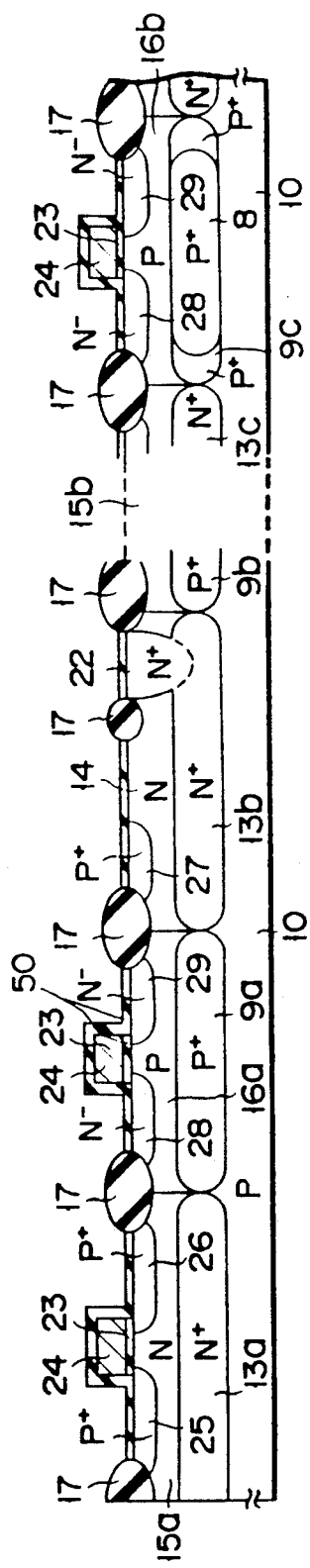
Figure 8H:
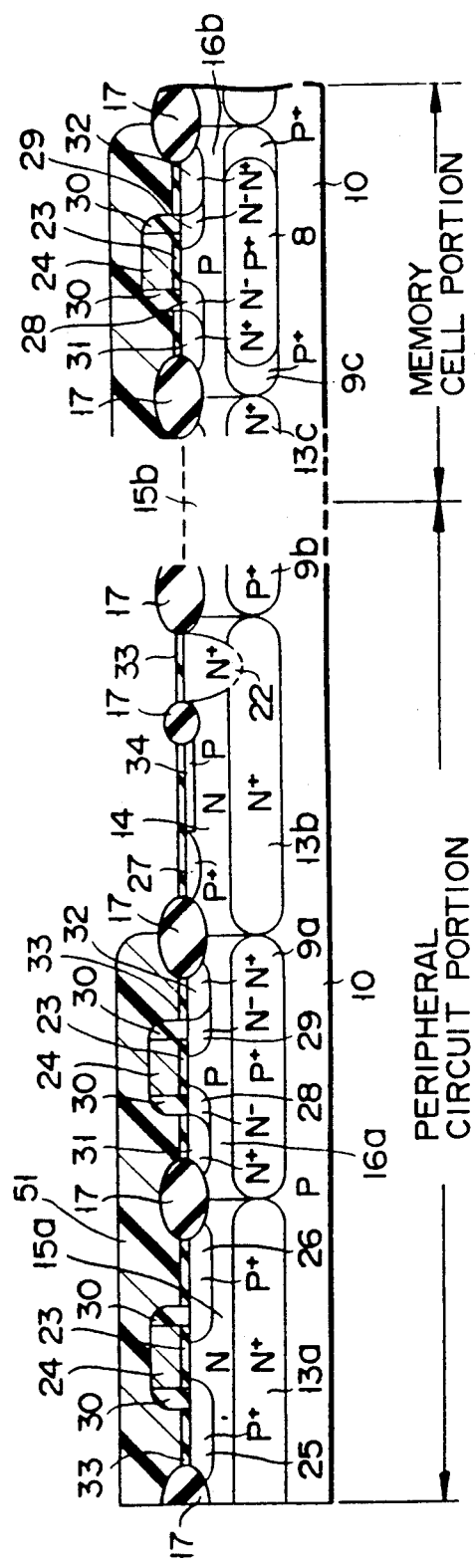

In the above-mentioned embodiment, the LDD structure is employed for the N-channel MOS transistor, and the normal structure for the P-channel MOS transistor. It is evident that an appropriate structure may be used according to the size of the element. Impurity distributions in the N-well region and in the P-well region of the MOS transistor portion thus structured are shown in FIGS. 5 and 6, and an impurity distribution in the N-well region of the bipolar transistor portion is shown in FIG. 7.

Figure 4A:
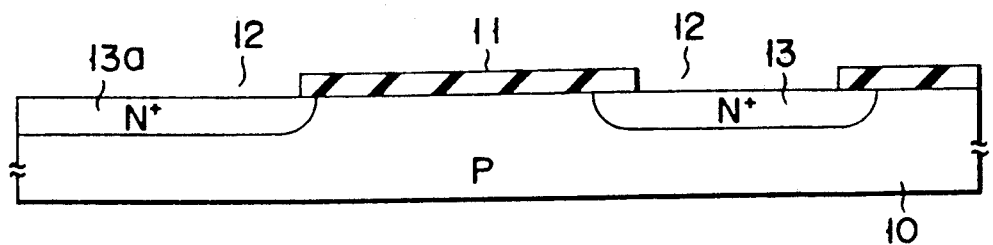
Figure 4B:
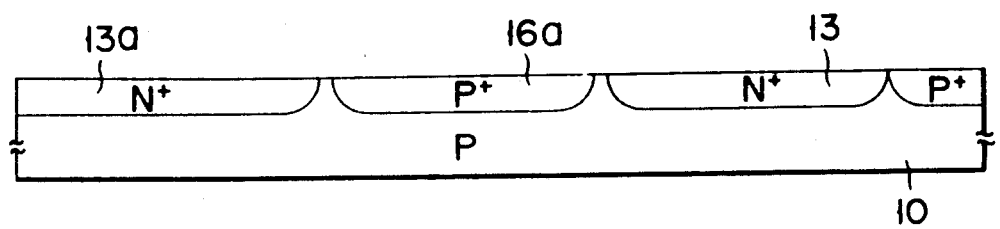
Figure 4C:
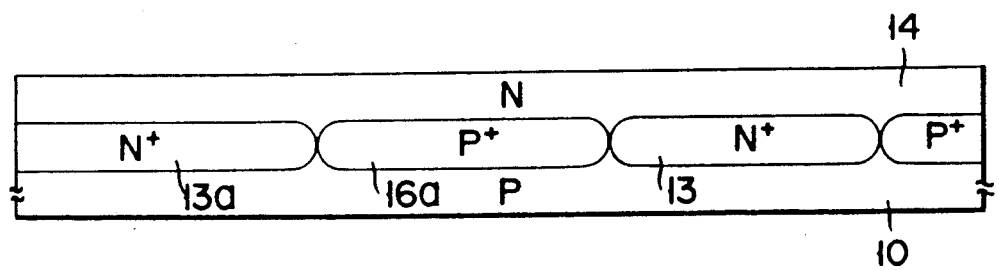
Figure 4D:
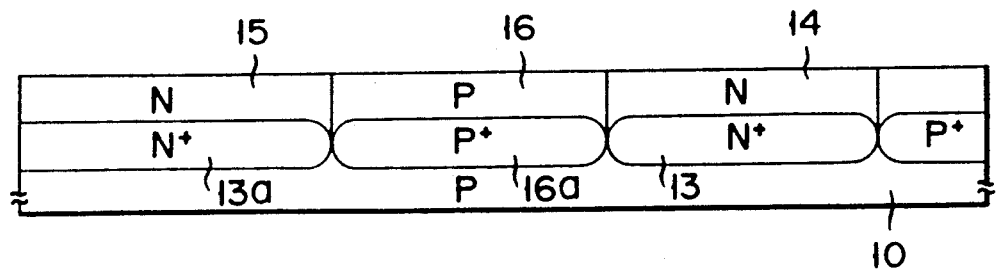
Figure 4G:
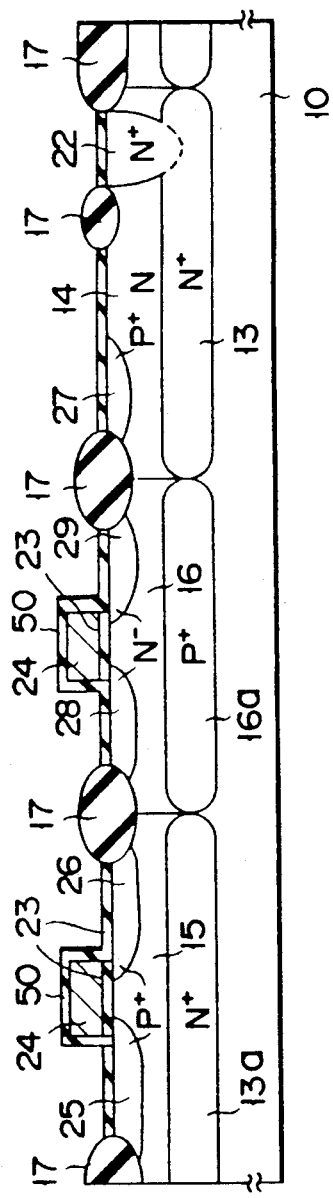
Figure 4H:
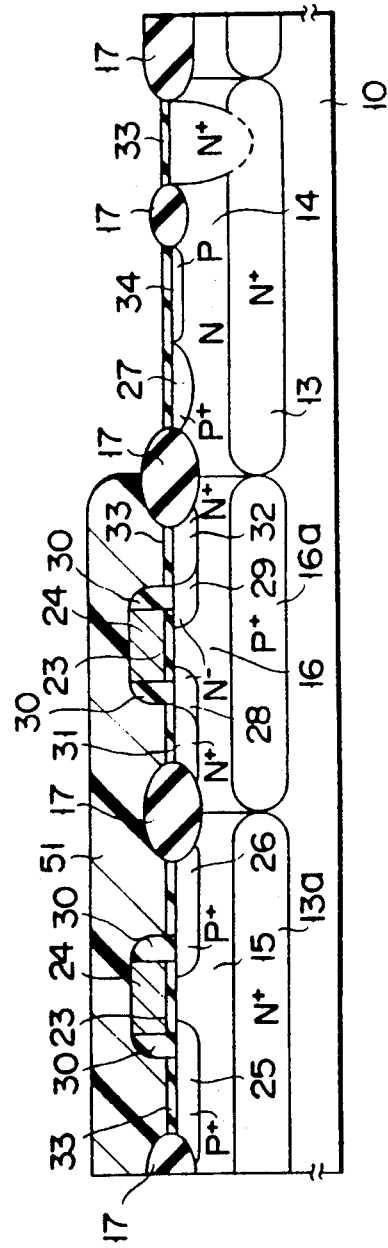
Figure 4I:
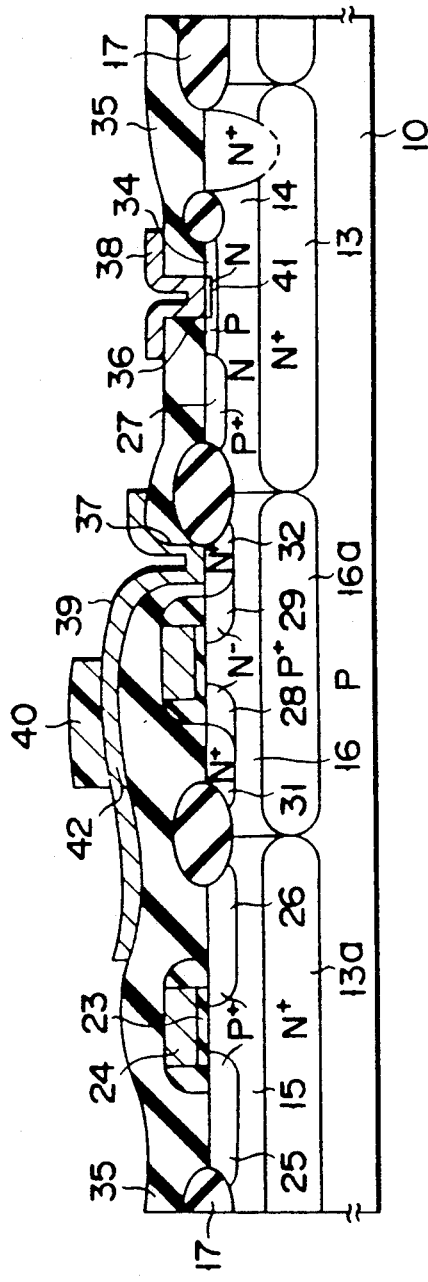
Figure 4J:
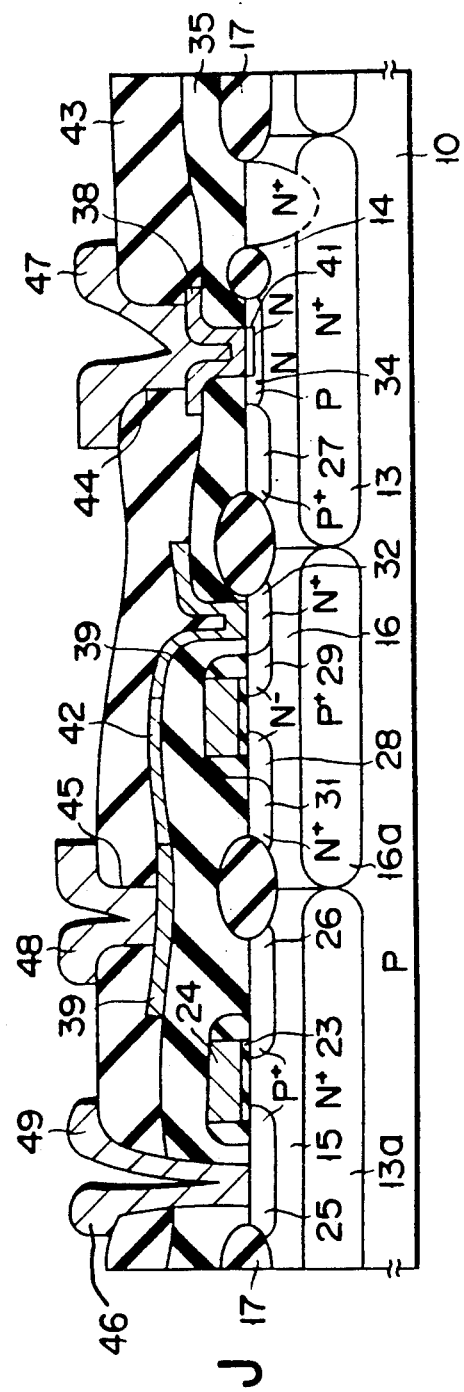

The advantages of the semiconductor device thus structured as shown in FIG. 4J will be described below.

Figures of the characteristics of a conventional bipolar CMOS transistor of 0.8μ or less in gate length and of h$_{fe}$ (current multification factor) are unsatisfactory where: BV$_{CBO}$ (base-collector breakdown voltage) = 15 V; BV$_{CEO}$ (emitter-collector breakdown voltage) = 5 V; V$_{AF}$ (early voltage) = 10 V; and f$_T$ (cut-off frequency) = 1 GHz when Ic (collector current) = 10 mA. This is due to the fact that an impurity concentration in the N-well region as the collector layer 53 is high, and therefore, the impurity concentration is distributed such that it gradually decreases from the surface of the N-well layer 53 inwardly toward the layer 53, viz., an inclination exists in a profile of the impurity concentration. In a bipolar CMOS transistor of the same specified values that has a structure according to the present invention, the corresponding characteristics are improved as follows: $BV_{CBO}=41$ V; $BV_{CEO}=13$ V; $V_{AF}=51$ V; and $f_T=3$ GHz when Ic=10 mA. This is due to the fact that the N-type epitaxial layer as the collector layer 14 is intact, and an impurity concentration therein is low and uniformly distributed in the layer, viz, no inclination exists in the impurity concentration profile. Further, in the semiconductor device according to the present invention, the P-well region 16 forming an NMOS transistor is formed by ion implantation, and a subsequent annealing applied to it is performed at low low temperature and for a short time, to prevent the impurity from being diffused from the P+ region 16a to the P− well region 16. Accordingly, a high performance MOS transistor having a gate length of 0.8 μm or less can be provided. Furthermore, an impurity concentration in the P+ buried layer 16a' may be set to be high, and therefore the resultant semiconductor device is insensitive to soft error. Therefore, the semiconductor device according to the present invention is suitable for a device in which any soft error must be prevented from occurring, such as memory LSIs.

When an epitaxial layer (first N-well region) to form a bipolar transistor in a semiconductor device according to the present invention, is formed, a concentration of an impurity in the epitaxial layer is preferably set to between $5\times10^{15}$ cm$^{-3}$ to $2\times10^{16}$ cm$^{-3}$. In the semiconductor device according to the present invention, the epitaxial layer is followed by ion implantation to form a second N-well region in a region in which a PMOS transistor is to be formed, and another ion implantation to form a P-well region in a region in which an NMOS transistor is to be formed. In this case, an impurity concentration in each of those wells is preferably set to between $4\times10^{16}$ cm$^{-3}$ to $2\times10^{17}$ cm$^{-3}$. In the case of a device of the type in which soft error must be prevented, such as a memory LSI, an impurity concentration in the P+ buried region 16a' is in the range of $1\times10^{16}$ cm$^{-3}$ to $5\times10^{17}$ cm$^{-3}$, as practically preferable values. Further, the anneal following the formation of the epitaxial layer at 1050° C. is limited to less than 10 minutes in order to prevent the impurity from diffusing from the P+ region 16a to the P-well region 16 of the NMOS transistor.

A second embodiment of a semiconductor device according to the present invention will be described with reference to FIGS. 8A through 8J show a sequence of process steps of a method of forming a semiconductor device according to the second embodiment of the present invention.

To start, an insulating film 11 is deposited on the crystal surface of a P-type silicon semiconductor substrate 10. The crystal indices of the crystal surface is (100). The insulating film 11 is selectively etched away by a photoetching method, to form openings 12a, 12b, and 12c. The openings 12 define the locations at which N+ buried collector regions 13a, 13b and 13c are to be formed. Subsequently, the N+ buried collector regions 13a, 13b and 13c are formed by introducing antimony Sb into the surface region of the substrate 10 exposed by the openings 12a, 12b and 12c using a vapor phase diffusion method or a solid diffusion method. Alternatively, arsenic As or Sb is ion implanted into the surface region of the substrate 10 exposed by the same openings. See FIG. 8A.

The remaining insulating film 11 is completely removed. After the removal of the film 11, boron B+ is ion implanted into the entire surface of the wafer under the condition of 100 KeV of acceleration voltage and $6\times10^{12}$ cm$^2$ of dosage, thereby to form first P+ buried regions 9a, 9b and 9c whose impurity concentrations are in the range of $1\times10^{16}$ cm$^{-3}$ to $7\times10^{16}$ cm$^{-3}$. Then, by photo etching process, B+ ions are doped into only a region in which a memory cell array is to be formed. The condition of the ion implantation is 100 KeV of accelerating voltage and $3\times10^{13}$ cm$^{-2}$ of dosage, for example. The implantation forms a second P+ buried region of a high concentration of $8\times10^{16}$ cm$^{-3}$ to $1\times10^{18}$ cm$^{-3}$. See FIG. 8B.

To prevent the structure from contamination during ion implantation, the entire surface of the substrate may be coated with an oxide film of 50 Å before the formation of the first and second P+ buried regions 9a-9c and 8 of high impurity concentration. After the ion implantation, the structure may be annealed at at least 850° C., in order to cure the damages of the substrate caused by the ion implantation and activate the doped impurity. Further, the first P+ buried regions 9a, 9b and 9c of high impurity concentration, that are formed by doping the impurity into the entire surface of the structure, may be formed by selectively doping the same. The second P+ buried region 8 may be formed apart from the N+ buried region 13c by at least 2 μm. Such a distance is provided preventing from decreasing the withstand voltage between P+ buried region 8 and N+ buried region 13c. Thereafter, an N-type epitaxial layer 14 containing phosphorus P of $5\times10^{15}$ cm$^{-3}$ to $2\times10^{16}$ cm$^{-3}$ is formed over the entire surface of the substrate 10 by an epitaxial growth method. Temperature for the epitaxial growth is 1130° C. The thickness of the epitaxial layer 14 is 1.2 μm. See FIG. 8C.

A mask (not shown) for ion implantation is formed by a photoetching method. By using this mask, phosphorus P ions are doped into regions of the N-type epitaxial layer 14 in which PMOS transistors or PMOS transistors are to be formed. As a result, N-well regions 15a and 15b of impurity concentration of about $2\times10^{16}$ cm$^{-3}$ are selectively formed. In this case, the P ions are accelerated at 160 KeV and $5\times10^{12}$/cm$^2$ of dosage. Then, by using another mask for ion implantation, boron B ions are doped into regions of the N-type epitaxial layer 14 in which NMOS transistors of the CMOS transistors and NMOS transistors in a memory cell portion are to be formed. As a result, P-well regions 16a and 16b of impurity concentration of about $2\times10^{16}$ cm$^{-3}$ to $2\times10^{17}$ cm$^{-3}$ are selectively formed. In this case, the P ions are accelerated at 100 KeV and $6\times10^{12}$/cm$^2$ of dosage. See FIG. 8D.

In this process step, the formation of the N-well region 15a to 15c follows the formation of the P-well regions 16a to 16c.

Succeedingly, field oxide films 17 to isolate MOS transistors from one another and MOS transistors from bipolar transistors are formed by a selective oxidizing method. The thickness of the field oxidizing film 17 is approximately 6000 Å. Before formation of the field oxide films 17, an ion implanting region 18 for preventing a field inversion is formed in a self-align manner. A dummy gate oxide film 19 of 150 Å in thick is formed over the entire surface of the resultant structure by thermal oxidation. Thereafter, channel ion implanting regions 20 and 21 that are for making uniform the threshold values of P- and N-channel MOS transistors and for preventing occurrence of punch-through phenomenon, are respectively formed in the surface regions of the N- and P-well regions 15a and 15b and 16a and 16b, through the dummy gate oxide film 19. To form the channel ion doping region 20 for the N-well region 15a and 15b, B ions are first implanted at 20 KeV of acceleration voltage and $3 \times 10^{12}/cm^2$ of dosage. Then, P ions are doped at a dosage of $2 \times 10^{12}/cm^2$ under acceleration voltage of 240 KeV. To form the channel ion doping region 21 for the N-well region 16a and 16b, B ions are first implanted at 20 KeV of acceleration voltage and $4 \times 10^{12}/cm^2$ of dosage. Then, P ions are doped at dosage of $1 \times 10^{16}/cm^2$ under an acceleration voltage of 320 KeV, thereby to form a deep $N^+$ type ion doping region 22 that passes through the epitaxial layer 14 and reaches the buried collector region 13b. See FIG. 8E.

Then, the dummy gate oxide film 19 is completely removed, and a gate oxide film 23 of about 150 Å in thickness is formed over the entire surface of the gate oxide film 23 and the field oxide film 17 by an oxidizing process. Further, polycrystalline silicon is deposited over the entire surface of the structure by CVD (chemical vapor deposition), thereby to form a polycrystalline silicon layer 24 of a predetermined thickness. Subsequently, phosphorus P is diffused into the polycrystalline silicon layer 24, thereby to lower the resistance of the layer 24. See FIG. 8F.

The polysilicon layer 24 and the gate oxide film 23 are patterned by a photoetching process, to form the gate electrodes 24 of the MOS transistors on the N-well regions 15a and 15b and the P-well regions 16a and 16b. The structure is placed in an oxygen atmosphere and heated at 900° C., to form a post oxide film 50 over the entire surface of the structure. Succeedingly, with a mask formed by photo etching, and a mask of the field oxide films 17 and the gate electrodes, $BF_2^+$ ions are doped into the N-well region at the acceleration voltage of 50 KeV and the dosage of $5 \times 10^{15}/cm^2$, so that a $P^+$-type source region 25 and a drain region 26 are formed in the surface region of the N-well region 15a. At this time, $BF_2^+$ ions are doped into the N-type epitaxial layer 14 on the buried collector region 13b, to form an external base region 27 of a bipolar transistor. Further, with a mask formed by photo etching, and a mask of the field oxide film 17 and the gate electrode, phosphorus ions are implanted into the P-well region 16a and 16b under the condition of 60 KeV of acceleration voltage and $4 \times 10^{13}/cm^2$, to form an $N^-$ type source region 28 and a drain region 29 in the surface region. See FIG. 8G.

The entire surface of the structure is covered with a $CVD-SiO_2$ film 30 of 2000 Å. The $CVD-SiO_2$ film 30 is selectively etched away, leaving the film 30 on only the side wall of the gate electrode. For the etching, an anisotropy etching process such as RIE (reactive ion etching) process. A photoresist mask (not shown) is formed allowing only the P-well region to be exposed. The P-well regions 16a and 16b are doped with arsenic As ions under the condition of 50 KeV of acceleration energy and $5 \times 10^{15}/cm^2$ of dosage, so that an $N^+$-type source region 31 and a drain region 32 are formed in the surface regions of the P-well regions 16a and 16b. In this way, an NMOS transistor of the so-called LDD structure is formed in this P-well regions 16a and 16b. The structure is placed in an $O_2$ atmosphere and heated at 900° C. for 30 minutes. As a result, a post-oxide film 33 is formed. Then, the surfaces of the P-well region 16a and 16b and the N-well regions 15a and 15b are covered with a photoresist 51. Following this, $BF_2$ ions are implanted into the N-epitaxial layer 14 on the buried collector region 13b, under the condition of 30 KeV of acceleration energy and $5 \times 10^{13}/cm^2$ of dosage. By this doping of $BF_2$, a P-type internal base region 34 is formed in the N-type epitaxial layer 14 on the buried collector region 13. See FIG. 8H.

A $CVD-SiO_2$ film 35 of 2000 Å thick as an interlaying insulating film is formed over the entire surface of the resultant structure. The $CVD-SiO_2$ film 35 is selectively etched away to form a contact hole 36 reaching the surface of the internal base region 34, and a contact hole 37 reaching the surface of the $N^+$-type drain region 32 for the N-channel MOS transistor in the memory cell portion. Thereafter, a polycrystalline layer of 2000 Å is formed over the entire surface of the resultant structure. The polycrystalline layer is patterned. Those portions of the polysilicon layers where the emitter electrode and high resistance element, and interconnection wires are to be formed, are left. These polysilicon layers are denoted as 38 and 39. After the polycrystalline layer 39 is partially covered with a mask 40 of photoresist, ions are implanted into the polycrystalline layers 38 and 39 at 50 KeV and $5 \times 10^{15}/cm^2$ to form an N-type emitter region 41 in the internal base region 34. At the same time, a resistance of the polycrystalline silicon layer 38 is reduced to form an emitter electrode of the bipolar transistor. A resistance of the polycrystalline silicon layer 39 except a portion of layer 39 it covered with the mask 40 is reduced to form a drain interconnection, a polycrystalline silicon 39 in the portion covered with the mask 40, and a high resistance element 42. To secure better contact of the emitter electrode of the bipolar transistor and the drain interconnection of the N-channel MOS transistor, the structure is preferably subjected to a rapid anneal after the above ion implantation. In the anneal, the structure is heated to between 950° C. to 1050° C. for 5 seconds to one minutes. See FIG. 8I.

To flatten the surface of the structure, an interlayer insulating film 43 including a $CVD-SiO_2$ film and a BPSG film is formed over the entire surface of the structure. The interlayer insulating film 43 is opened to a contact hole 44 to expose a part of the surface of the polycrystalline silicon layer 38 as the emitter electrode, a contact hole 45 that exposes a part of the surface of the polycrystalline silicon layer 39 as the drain electrode, and a contact hole 46 that passes the interlayer insulating film 43 and the $CVD-SiO_2$ film 35 underlying the film 43 and exposes a part of the surface of the source of the P-channel MOS transistor. Aluminum for interconnection is deposited over the entire surface of the structure, and is patterned to form aluminum interconnections 47, 48 and 49. See FIG. 8J.

In the semiconductor device thus manufactured, a part of the polycrystalline silicon layer 39 serves as a high resistance element 42, which is used as a load resistor of a static memory cell.

Figure 9:
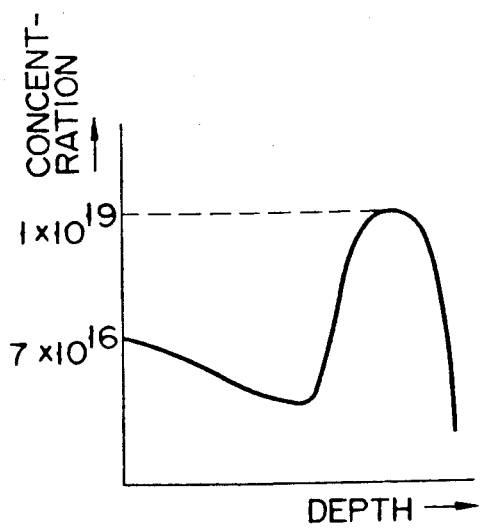
FIG. 9 is a graph showing a profile of an impurity concentration in a second N-well region of a PMOS transistor in a peripheral portion shown in FIG. 8J.
Figure 11:
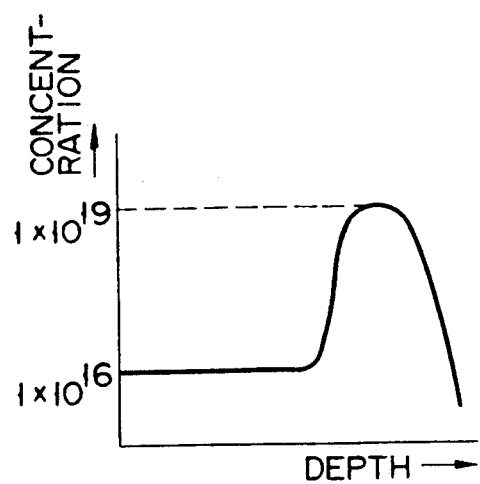
FIG. 11 is a graph showing a profile of an impurity concentration in a first well region for a bipolar transistor in the peripheral circuit shown in FIG. 8J.
Figure 10:
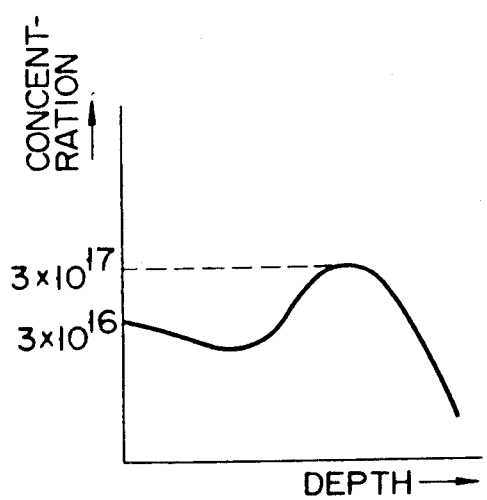
FIG. 10 is a graph showing a profile of an impurity concentration in a P-well region for an NMOS transistor in a memory cell portion shown in FIG. 8J.
Figure 12:
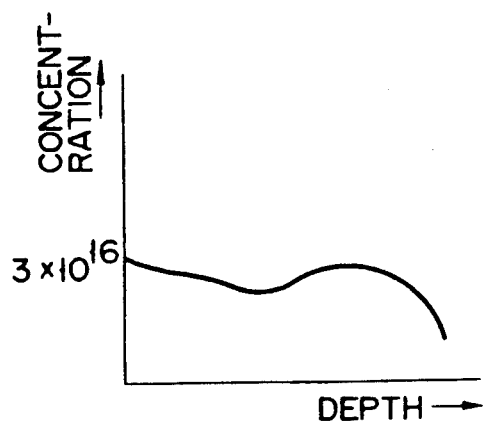
FIG. 12 is a graph showing a profile of an impurity concentration in a P-well region of an NMOS transistor in the peripheral portion shown in FIG. 8J.

A profile of impurity distribution in the N-well region 15a of the PMOS transistor is shown in FIG. 9. A profile of impurity distribution in the P-well region 16b of the NMOS transistor in the memory cell portion is shown in FIG. 10. A profile of impurity distribution in the P-well region 150 of the NMOS transistor in the peripheral circuit portion is shown in FIG. 12.

As seen from the foregoing description, in a semiconductor device according to the present invention, the P$^-$ region 9c is interlaid between the P$^-$ region 8 and the N$^-$ region 13c, and an impurity concentration of the region 9c is lower than that in the region 8. Therefore, a breakdown voltage between the regions 8 and 13c is improved. The impurity concentration in the P$^-$ region 8 is set at a value between $8 \times 10^{16}$ cm$^{-3}$ to $1 \times 10^{18}$ cm$^{-3}$. With this feature, a static RAM of soft error resistance of 10 FIT could be realized according to the present invention. This figure should be compared with 10,000 FIT of the conventional RAM.

As a modification of the present invention, the LDD structure is employed for the N-channel MOS transistor, and the normal structure for the P-channel MOS transistor. It is evident that an appropriate structure may be used according to the size of the element. The side wall used when the LDD structure is formed may be made of polysilicon. The formation of the source region 25 and the drain region 26 may follow the formation of the source regions 16 and 31 and the drain region 32. The thickness of the epitaxial layer 14 in which an LSI is formed is preferably 1.5 μm or less. An impurity concentration in this epitaxial layer is preferably set to between $5 \times 10^{15}$ cm$^{-3}$ to $2 \times 10^{16}$ cm$^{-3}$.

In the semiconductor device according to the present invention, an impurity concentration in the P$^-$ buried regions 9a to 9c of high concentration is preferably set to between $1 \times 10^{16}$ cm$^{-3}$ to $7 \times 10^{17}$ cm$^{-3}$. An impurity concentration in the P$^+$ buried region 8 of high concentration is preferably set to between $8 \times 10^{16}$ cm$^{-3}$ to $1 \times 10^{18}$ cm$^{-3}$. When the region 8 is formed, it is preferably apart from the region 13c by at least 2 μm.

Further, the anneal following the formation of the epitaxial layer in which an LSI is formed is performed at 1050° C. or less. This feature prevents the impurity from being diffused from the P$^-$ high concentration buried regions 9a and 8 to the layer above those regions.

What is claimed is:

1. A semiconductor device having a bipolar transistor and a CMOS transistor comprising:
    a semiconductor substrate of a first conductivity type;
    a first high concentration buried region of the first conductivity type for preventing punch-through and soft error, said first high concentration buried region being formed on said semiconductor substrate;
    second and third high concentration buried regions of a second conductivity type formed on said semiconductor substrate and located on either side of said first high concentration buried region;
    a first well region of the second conductivity type, with a surface region, formed on said third high concentration buried region of the second conductivity type, a bipolar transistor being formed in the surface region of said first well region;
    a second well region of the second conductivity type, with a surface region, formed on said second high concentration buried region of the second conductivity type, a first channel MOS transistor being formed in the surface region of said second well region, and an impurity concentration of said second well region being higher than an impurity concentration of said first well region; and
    a third well region of the first conductivity type formed on said first high concentration buried region of the first conductivity type, a second channel MOS transistor being formed in the surface region of said third well region.

2. A semiconductor device according to claim 1, wherein said first well region is used while being doped with no impurity after formation of an epitaxial layer that is formed on said first, second and third high concentration buried regions.

3. A semiconductor device according to claim 2, wherein said epitaxial layer contains an N-type impurity at an impurity concentration in a range of $5 \times 10^{15}$ cm$^{-3}$ to $2 \times 10^{16}$ cm$^{-3}$.

4. A semiconductor device according to claim 3, wherein said N-type impurity is phosphorus.

5. A semiconductor device according to claim 1, wherein said CMOS transistor includes a PMOS transistor having a gate length shorter than 0.8 μm.

6. A semiconductor device having a bipolar transistor and a CMOS transistor comprising:
    a semiconductor substrate of a first conductivity type;
    a first high concentration buried region of the first conductivity type for preventing punch-through, said first high concentration buried region being formed on a portion of said semiconductor substrate to be used for a peripheral circuit;
    a second high concentration buried region of the first conductivity type, for preventing soft error, formed in a portion of said semiconductor substrate to be used as a memory cell portion, an impurity concentration of said second high concentration buried region being higher than an impurity concentration of said first high concentration buried region;
    third and fourth high concentration buried regions of a second conductivity type formed on said semiconductor substrate and located on either side of said first high concentration buried region;
    a first well region of the second conductivity type, with a surface region, said first well region formed on said fourth high concentration buried region of the second conductivity type, a bipolar transistor being formed in the surface region of said first well region;
    a second well region of the second conductivity type, with a surface region, said second well region formed on said third high concentration buried region, a first channel MOS transistor being formed in the surface region of said second well region, and an impurity concentration of said second well region being higher than an impurity concentration of said first well region; and
    third and fourth well regions of the first conductivity type, each with a surface region, said third and fourth well regions formed, respectively, on said first and second high concentration buried regions, a second and a third channel MOS transistor respectively being formed in the surface region of each of said third and fourth well regions.

7. A semiconductor device according to claim 6, wherein said first well region is used while being doped with no impurity after formation of an epitaxial layer that is formed on said first, second, third and fourth high concentration buried regions.

8. A semiconductor device according to claim 7, wherein said epitaxial layer contains an N-type impurity at an impurity concentration in a range of $5 \times 10^{15}$ cm$^{-3}$ to $2 \times 10^{16}$ cm$^{-3}$.

9. A semiconductor device according to claim 8, wherein said N-type impurity is phosphorus.

10. A semiconductor device according to claim 6, wherein said second high concentration buried region is isolated from a fifth high concentration buried region of the first conductivity type which is located between said second and fourth high concentration regions and is separated from said second high concentration buried region of the second conductivity type by at least 2 μm.

11. A semiconductor device according to claim 6, wherein said CMOS transistor includes a PMOS transistor having a gate length shorter than 0.8 μm.

* * * * *